(12) United States Patent
Bryant et al.

(10) Patent No.: US 10,429,736 B2
(45) Date of Patent: *Oct. 1, 2019

(54) METHOD OF MAKING A FLEXOGRAPHIC PRINTING PLATE

(71) Applicant: MacDermid Graphics Solutions, LLC, Waterbury, CT (US)

(72) Inventors: Laurie A. Bryant, Douglasville, GA (US); Kyle P. Baldwin, Acworth, GA (US); Ryan W. Vest, Cumming, GA (US)

(73) Assignee: MacDermid Graphics Solutions LLC, Waterbury, CT (US)

( * ) Notice: Subject to any disclaimer, the term of this patent is extended or adjusted under 35 U.S.C. 154(b) by 9 days.

This patent is subject to a terminal disclaimer.

(21) Appl. No.: 15/498,844

(22) Filed: Apr. 27, 2017

(65) Prior Publication Data

US 2018/0314157 A1    Nov. 1, 2018

(51) Int. Cl.
*G03F 7/11* (2006.01)
*G03F 7/20* (2006.01)
*B41C 1/00* (2006.01)
*G03F 7/027* (2006.01)
*B41N 1/12* (2006.01)

(52) U.S. Cl.
CPC ............ *G03F 7/2012* (2013.01); *B41C 1/003* (2013.01); *G03F 7/027* (2013.01); *B41N 1/12* (2013.01)

(58) Field of Classification Search
CPC ....................................................... G03F 7/11
See application file for complete search history.

(56) References Cited

U.S. PATENT DOCUMENTS

| | | |
|---|---|---|
| 3,158,331 A | 11/1964 | Recchia |
| 3,265,765 A | 8/1966 | Holden |
| 3,597,080 A | 8/1971 | Gush et al. |
| 3,867,153 A | 2/1975 | MacLachlan |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 4,622,088 A | 11/1986 | Min |
| 5,135,827 A | 8/1992 | Bohm et al. |
| 5,213,949 A | 5/1993 | Kojima et al. |
| 5,223,375 A | 6/1993 | Berrier et al. |
| 5,262,275 A | 11/1993 | Fan |
| 5,813,342 A | 9/1998 | Strong |
| 5,925,500 A | 7/1999 | Yang et al. |
| 6,238,837 B1 | 5/2001 | Fan |
| 6,555,292 B1 * | 4/2003 | Huang ............... G03F 7/033 430/284.1 |
| 2006/0084008 A1 * | 4/2006 | Long ............... G03F 7/2014 430/302 |
| 2008/0107908 A1 | 5/2008 | Long et al. |
| 2011/0079158 A1 * | 4/2011 | Recchia ............ G03F 7/201 101/395 |
| 2014/0322649 A1 * | 10/2014 | Choi ............... G03F 7/09 430/270.1 |
| 2015/0090397 A1 * | 4/2015 | Matsumoto ........... B41C 1/05 156/246 |
| 2015/0097315 A1 * | 4/2015 | DeSimone ........ G03F 7/0037 264/401 |

FOREIGN PATENT DOCUMENTS

| | | |
|---|---|---|
| EP | 0456336 | 11/1991 |
| EP | 0640878 | 3/1995 |
| GB | 1366769 | 9/1974 |

\* cited by examiner

*Primary Examiner* — Chanceity N Robinson
(74) *Attorney, Agent, or Firm* — Carmody Torrance Sandak & Hennessey LLP

(57) ABSTRACT

A method of producing a flexographic printing plate using a continuous liquid interphase is provided herein. This method allows for significantly reduced production times and fewer preparation steps compared to standard non-continuous techniques and results in less waste than typical methods for preparing flexographic printing plates. The printing plate provided by using continuous liquid interphase production results in a printing plate with desirable elastomeric elongation, desirable hardness, plate thickness in the range of 0.030 inches to 0.250 inches, and comprises printing dots with desirable characteristics.

25 Claims, No Drawings

METHOD OF MAKING A FLEXOGRAPHIC PRINTING PLATE

FIELD OF THE INVENTION

The present invention relates generally to an improved method of making flexographic printing plates.

BACKGROUND OF THE INVENTION

Flexography is a method of printing that is commonly used for high-volume runs. Flexographic printing plates are employed for printing on a variety of substrates such as paper, paperboard stock, corrugated board, films, foils and laminates. Newspapers and grocery bags are prominent examples. Coarse surfaces and stretch films can be economically printed only by means of flexography.

Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made. A typical flexographic printing plate as delivered by its manufacturer is a multilayered article made of, in order, a backing or support layer; one or more unexposed photocurable layers; optionally a protective layer or slip film; and often, a protective cover sheet.

The support (or backing) layer lends support to the plate. The support layer can be formed from a transparent or opaque material such as paper, cellulose film, plastic, or metal. Preferred materials include sheets made from synthetic polymeric materials such as polyesters, polystyrene, polyolefins, polyamides, and the like. One widely used support layer is a flexible film of polyethylene terephthalate.

The photocurable layer(s) can include any of the known polymers, monomers, initiators, reactive and/or non-reactive diluents, fillers, and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety.

Photocurable materials generally cross-link (cure) and harden through radical polymerization in at least some actinic wavelength region. As used herein, "actinic radiation" refers to radiation that is capable of polymerizing, crosslinking or curing the photocurable layer. Actinic radiation includes, for example, amplified (e.g., laser) and non-amplified light, particularly in the ultraviolet (UV) and violet wavelength regions.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "direct to plate" process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

Processing steps for forming flexographic printing plates with relief image printing elements typically include the following:

1) Image generation, which may be mask ablation for digital "computer to plate" printing plates or negative production for conventional analog plates;
2) Back exposure to create a floor layer in the photocurable layer and establish the depth of relief;
3) Face exposure through the mask (or negative) to selectively crosslink and cure portions of the photocurable layer not covered by the mask, thereby creating the relief image;
4) Development to remove unexposed photopolymer by solvent (including water) or thermal development; and
5) If necessary, post exposure and detackification.

Removable coversheets are also preferably provided to protect the photocurable printing element from damage during transport and handling. Prior to processing the printing elements, the coversheet is removed and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer solvent (or alternatively, thermal development) removes the unexposed areas of the photopolymerizable layer, leaving behind a printing relief that can be used for flexographic printing.

As used herein "back exposure" refers to a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

Following the brief back exposure step (i.e., brief as compared to the imagewise exposure step which follows), an imagewise exposure is performed utilizing a digitally-imaged mask or a photographic negative mask, which is in contact with the photocurable layer and through which actinic radiation is directed.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or thermal development, which typically uses heat plus a blotting material. The resulting surface has a relief pattern, which typically comprises a plurality of dots that reproduces the image to be printed. After the relief image is developed, the resulting relief image printing element may be mounted on a press and printing commenced. In addition, if necessary, after the development step, the relief image printing element may be post exposed and/or detackified as is generally well known in the art.

The shape of the dots and the depth of the relief, among other factors, affect the quality of the printed image. It is also very difficult to print small graphic elements such as fine dots, lines and text using flexographic printing plates.

In addition, maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (i.e., the dot is not "held" on plate and/or on press). Alternatively, if the dots survive processing they are susceptible to damage on press. For example small dots can fold over and/or partially break off during printing, causing either excess ink or no ink to be transferred.

As described in U.S. Pat. No. 8,158,331 to Recchia and U.S. Pat. Pub. No. 2011/0079158 to Recchia et al., the subject matter of each of which is herein incorporated by reference in its entirety, a particular set of geometric characteristics can define a flexographic printing plate dot shape that yields superior printing performance, including but not limited to (1) planarity of the dot surface; (2) shoulder angle of the dot; (3) depth of relief between the dots; and (4) sharpness of the edge at the point where the dot top transitions to the dot shoulder.

Flexographic printing elements can additionally be made from liquid photopolymer resins and have the advantage that the uncured resin can be reclaimed from the non-image areas of the printing elements and used to make additional printing plates. Liquid photopolymer resins have a further advantage as compared to sheet polymer in terms of flexibility, which enables the production of any required plate gauge simply by changing the machine settings. The plates are typically formed by placing a layer of liquid photopolymerizable resin on a glass plate but separated from the glass plate by a substrate and/or a coverfilm. Actinic light, such as UV light, is directed against the resin layer through a negative. The result is that the liquid resin is selectively cross-linked and cured to form a printing image surface that mirrors the image on the negative. Upon exposure to actinic radiation, the liquid photopolymer resin polymerizes and changes from a liquid state to a solid state to form the raised relief image. After the process is complete, non-crosslinked liquid resin can be recovered (i.e., reclaimed) from the printing plates and recycled in the process to make additional plates.

Various processes have been developed for producing printing plates from liquid photopolymer resins as described, for example, in U.S. Pat. No. 5,213,949 to Kojima et al., U.S. Pat. No. 5,813,342 to Strong et al., U.S. Pat. Pub. No. 2008/0107908 to Long et al., and in U.S. Pat. No. 3,597,080 to Gush, the subject matter of each of which is herein incorporated by reference in its entirety.

Typical steps in the liquid platemaking process include:
(1) casting and exposure;
(2) reclamation;
(3) washout;
(4) post exposure;
(5) drying; and
(6) detackification.

In the casting and exposure step, a photographic negative is placed on a glass platen and a coverfilm is placed on the negative in an exposure unit. All of the air is then removed by vacuum so that any wrinkling of the negative or coverfilm can be eliminated. Thereafter, a layer of liquid photopolymer and a backing sheet (i.e., a thin layer of polyester or polyethylene terephthalate) are applied on top of the coverfilm and negative. The backing sheet may be coated on one side to bond with the liquid photopolymer and to serve as the back of the plate after exposure. Then upper and/or lower sources of actinic radiation (i.e., UV lights) are used to expose the photopolymer to actinic radiation to crosslink and cure the liquid photopolymer layer in the areas not covered by the negative. The top sources of actinic radiation are used to create the floor layer of the printing plate (i.e., back exposure) while the bottom sources of actinic radiation are used to face expose the photopolymer to actinic radiation through the negative to create the relief image.

After the exposure is complete, the printing plate is removed from the exposure unit and the photopolymer that was not exposed to actinic radiation (i.e., the photopolymer covered by the negative) is reclaimed for further use. In liquid platemaking, resin recovery is an important factor relating to the production of photopolymerizable resin printing plates because the resins used to produce the plates are relatively expensive. In all areas not exposed to UV radiation, the resin remains liquid after exposure and can then be reclaimed. In a typical process, the uncured resin is physically removed from the plate in a process step so that the uncured resin can be reused in making additional plates. This "reclamation" step typically involves squeegeeing, vacuuming or otherwise removing liquid photopolymer remaining on the surface of the printing plate.

Stereolithography is yet another conventional process for providing flexographic printing plates, which is an additive layering process that is very time consuming. Each layer of photopolymer is cured, lifted, back filled with more resin, cured again, and the process is repeated over and over until the required thickness and plate properties are achieved. The process of creating flexographic printing plates using stereolithography can take anywhere from hours to more than a day.

Thus, it would be desirable to provide an improved method of making flexographic printing plates, which involves fewer process steps, is less time consuming, creates less waste, and reliably provides printing plates comprising printing dots with desirable characteristics.

SUMMARY OF THE INVENTION

It is an object of the present invention to provide a flexographic printing plate using a continuous liquid interphase 3D production method.

It is still another object of the present invention to streamline the process of making a flexographic printing plate.

It is still another object of the present invention to provide an improved method of creating a flexographic printing plate having tailored printing dots in terms of edge definition, shoulder angle and/or print surface.

It is another object of the present invention to provide a method of tailoring or modifying the shape of printing dots on a flexographic printing plate made using a continuous liquid interphase 3D method for optimal printing on various substrates.

It is still another object of the present invention to provide a photocurable composition for use in the production of flexographic printing plates using a continuous liquid interphase 3D production method.

It is still another object of the current invention to create little to no waste using a continuous liquid interphase method of producing flexographic printing plates.

To that end, in one embodiment, a continuous liquid interphase method of making a flexographic printing plate is provided, comprising:
- a) providing a photocurable composition in a reservoir, wherein the photocurable composition comprises:
  - i) a binder resin;
  - ii) monomers;
  - iii) a photoinitiator; and
  - iv) a polymerization inhibitor;

wherein the reservoir contains a transparent bottom, and wherein actinic radiation is capable of shining through the transparent bottom; and
- b) providing a carrier plate comprising a substrate and a cured layer of photopolymer on said substrate such that the cured layer of photopolymer acts as the floor layer of the flexographic printing plate, wherein the carrier plate provides a surface on which the printing plate is formed, wherein the reservoir is below the carrier plate;
- c) bringing the cured layer of photopolymer on the carrier plate into contact with the photocurable composition in the reservoir;
- d) selectively providing actinic radiation beneath the transparent bottom of the reservoir in a pattern that corresponds to raised relief structures to be formed on the carrier plate, wherein the radiation crosslinks and cures areas of the photocurable composition in the reservoir;
- e) moving the carrier plate away from the reservoir while the actinic radiation continuously crosslinks and cures the photocurable composition to form a flexographic printing plate, wherein raised features of the flexographic printing plate are formed on the cured layer of photopolymer on the carrier plate simultaneously as the carrier plate is withdrawn from the reservoir.

Further to that end, in another embodiment, a continuous liquid interphase method of making a flexographic printing plate is provided, comprising:
- a) providing a photocurable composition in a reservoir of a three dimensional printer, wherein the photocurable composition comprises:
  - i) a binder resin;
  - ii) monomers; and
  - iii) a photoinitiator; and
- b) providing a carrier plate comprising a substrate and a cured layer of photopolymer on said substrate such that the cured layer of photopolymer acts as the floor layer of the flexographic printing plate, wherein the carrier plate provides a surface on which the flexographic printing plate is formed; and
- c) using the three dimensional printer to print photocurable composition onto the cured layer of photopolymer while exposing the printed photocurable composition to actinic radiation to cure such printed photocurable composition to form raised relief features on the cured layer of photopolymer.

DETAILED DESCRIPTION OF THE PREFERRED EMBODIMENTS

The present invention is directed to an improved method of making flexographic printing plates using a continuous liquid interphase 3D method, including without limitation continuous three dimensional printing.

By using a continuous liquid interphase printing method, a flexographic printing plate can be fabricated continuously, rather than layer by layer, which substantially reduces or eliminates the presence of cleavage lines present from typical additive methods. This also results in significant reduction in time needed to produce a flexographic printing plate.

The carrier plate comprises a substrate layer and a layer of cured photopolymer on the substrate layer. The substrate layer comprises either a flexible sheet of plastic material or a sheet of metal. The layer of cured photopolymer comprises any photopolymer useful in the fabrication of flexographic printing plates.

By using a precured layer of photopolymer as the floor layer substantial time is saved in the creation of the printing plate. Having the precured floor in place reduces the amount of photopolymer that must be applied via the liquid interphase printing method. Having the precured floor also allows for the ability to utilize either a photopolymer that is the same as the photopolymer used to create the relief or different therefrom. Using a photopolymer for the floor that has different physical properties from the photopolymer used to create the relief allows for a better fine tuning of the overall performance characteristics of the resulting flexographic printing plate.

As described herein, the purpose of the present invention is to provide an improved method of making a flexographic printing plate using a continuous liquid interphase method.

In one embodiment, the continuous process begins with a reservoir of liquid photopolymer, in which the bottom of the reservoir is transparent to actinic radiation. A carrier plate, which is the plate upon which the flexographic printing plate is to be built, is initially in direct contact with the liquid photocurable composition and is subsequently withdrawn from the from the reservoir as polymerization occurs. An actinic radiation source shines through the transparent bottom of the reservoir and selectively crosslinks and cures the liquid photocurable resin to form a flexographic printing plate. As the flexographic printing plate is selectively formed, the carrier plate is withdrawn from the base of reservoir. The liquid photocurable composition continues to be polymerized at the base of the reservoir until the flexographic printing plate is fully formed.

The base of the reservoir contains a surface that is semipermeable to the polymerization inhibitor which is present in the photocurable composition. There is a gradient formed within the reservoir in which the solid material created by the cross-linking of the photocurable composition and the non-polymerized material overlap at least partially. There is not a sharp interface defined by the amount of polymerization that has occurred and the amount of uncured photocurable composition present in the reservoir.

The semipermeable surface comprises a fluoropolymer, a rigid gas-permeable polymer, porous glass, or combination thereof. Because the polymerization inhibitor passes onto this surface, the build-up of cured polymer is prevented at the base of the reservoir, thereby promoting the cured photocurable composition to polymerize and cure on the carrier plate or onto the previously cured photocurable composition that has been selectively crosslinked and cured to form a flexographic printing plate. The reservoir can be filled with additional photocurable composition as needed.

The reservoir is essentially fixed or stationary, while the carrier plate moves away from the reservoir during production of the printing plate. Essentially fixed or stationary means only minor motion should occur that does not disrupt the continuous production of polymerized photocurable composition during the production of the flexographic printing plate. If disrupted, the polymerization may continue, although a cleavage line may form. Additionally, predetermined cleavage lines may be formed at locations deemed desirable before further continuous formation proceeds. The flexographic printing plates can be produced either parallel or perpendicular relative to the surface of the photocurable composition contained in the reservoir.

The source of actinic radiation is located below the reservoir and shines into the transparent bottom of the reservoir. Any conventional sources of actinic radiation can be used for this crosslinking and curing of the photocurable composition, including, for example, carbon arcs, mercury-vapor arcs, fluorescent lamps, electron flash units, electron beam units, LEDs and photographic flood lamps.

The formation of polymerized material on the surface of the carrier plate is continuous and the polymerized material is in constant contact with the photocurable composition in the reservoir until the formation of the flexographic printing plate is complete.

To that end, in one embodiment, a continuous liquid interphase method of making a flexographic printing plate is provided, comprising:
 a) providing a photocurable composition in a reservoir, wherein the photocurable composition comprises:
  i) a binder resin;
  ii) monomers;
  iii) a photoinitiator; and
  iv) a polymerization inhibitor;
  wherein the reservoir contains a transparent bottom, and wherein actinic radiation is capable of shining through the transparent bottom; and
 b) providing a carrier plate comprising a substrate and a cured layer of photopolymer on said substrate such that the cured layer of photopolymer acts as the floor layer of the flexographic printing plate, wherein the carrier plate provides a surface on which the printing plate is formed, wherein the reservoir is below the carrier plate;
 c) bringing the cured layer of photopolymer on the carrier plate into contact with the photocurable composition in the reservoir;
 d) selectively providing actinic radiation beneath the transparent bottom of the reservoir in a pattern that corresponds to raised relief structures to be formed on the carrier plate, wherein the radiation crosslinks and cures areas of the photocurable composition in the reservoir;
 e) moving the carrier plate away from the reservoir while the actinic radiation continuously crosslinks and cures the photocurable composition to form a flexographic printing plate, wherein raised features of the flexographic printing plate are formed on the cured layer of photopolymer on the carrier plate simultaneously as the carrier plate is withdrawn from the reservoir.

If three dimensional printing of the photocurable layer is used, the three dimensional printing device will generally comprise a reservoir to hold the photocurable material, an imaging system for curing the photocurable material as it is printed, and preferably a lifting platform for connecting to a molding tool. The imaging system can irradiate a light beam image to enable a portion of photocurable material to be cured as it is printed. Preferably, after the imaging system irradiates the light beam image, the lifting platform will drive photocurable material to slightly drop onto the surface which is being printed upon. Such a suitable three dimensional printing device is described in US Patent Application No. 2016/030266A1, the teachings of which are incorporated herein by reference in their entirety.

Further to that end, in another embodiment, a continuous liquid interphase method of making a flexographic printing plate is provided, comprising:
 a) providing a photocurable composition in a reservoir of a three dimensional printer, wherein the photocurable composition comprises:
  i) a binder resin;
  ii) monomers; and
  iii) a photoinitiator; and
 b) providing a carrier plate comprising a substrate and a cured layer of photopolymer on said substrate such that the cured layer of photopolymer acts as the floor layer of the flexographic printing plate, wherein the carrier plate provides a surface on which the flexographic printing plate is formed; and
 c) using the three dimensional printer to print photocurable composition onto the cured layer of photopolymer while exposing the printed photocurable composition to actinic radiation to cure such printed photocurable composition to form raised relief features on the cured layer of photopolymer.

A detackification step may be used if necessary and can involve the use of a germicidal unit (light finisher) to ensure a totally tack-free plate surface. This step is not required for all plates, as certain resins may be tack-free and thus printing press ready without the need for the detackification step.

The photocurable composition generally comprises one or more resins, binders and/or plasticizers in combination with one or more photo-initiators and one or more polymerization inhibitors.

Binder resins suitable for use in the present invention are addition-polymerizable ethylenically unsaturated compounds. The photocurable composition may contain a single resin or a mixture of resins. The photocurable composition also contains monomers that are typically reactive monomers especially acrylates and methacrylates. Such reactive monomers include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-imethylolpropane tetraacrylate, triacrylate of tris(hydroxyethyl)isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate. 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethanemethacrylate or acrylate oligomers and the like which can be added to the photopolymerizable composition to modify the cured product. Monoacrylates including, for example, cyclohexyl acrylate, isobornyl acrylate, lauryl acrylate and tetrahydrofurfuryl acrylate and the corresponding methacrylates are also usable in the practice of the invention. It is generally preferred that the one or more resins be present in at least an amount of 20% by weight of the photocurable composition.

Binder resins such as styrenic block copolymers are additionally usable in the compositions of the invention. Suitable binder materials include natural or synthetic polymers of conjugated diolefin hydrocarbons, including 1,2-polybutadiene, 1,4-polybutadiene, butadiene/acrylonitrile, butadiene/styrene, thermoplastic-elastomeric block copolymers e.g., styrene-butadiene-styrene block copolymer, styrene-isoprene-styrene block copolymer, etc., and copolymers. It is generally preferred that the styrenic block copolymers be present in at least an amount of 5% by weight of the photocurable composition.

The photocurable composition also optionally contains a compatible plasticizer. Suitable plasticizers include, but are not limited to, dialkyl phthalates, alkyl phosphates, polyethylene glycol, polyethylene glycol esters, polyethylene glycol ethers, polybutadiene, polybutadiene styrene copolymers, hydrogenated, heavy naphthenic oils, hydrogenated, heavy paraffinic oils, and polyisoprenes. Other useful plasticizers include oleic acid, lauric acid, etc. If used, the plasticizer is generally present in an amount of at least 5% by weight, based on weight of total solids of the photocurable composition.

Photoinitiators for use in the photocurable composition include benzoin alkyl ethers, such as benzoin methyl ether, benzoin ethyl ether, benzoin isopropyl ether and benzoin isobutyl ether. Another class of photoinitiators are the dialkoxyacetophenones such as 2,2-dimethoxy-2-phenylacetophenone and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthenequinone, methyl ethyl ketone, valerophenone, hexanophenone, alpha-phenylbutyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetopherione, benzaldehyde, alpha-tetralone, 9-acetylphenarithrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4.degree.-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-otolylphosphine can also be used as photoinitiators. Both free radical and cationic types of photopolymerization initiators may be used. It is generally preferred that the photoinitiators be present in at least an amount of 0.1% by weight of the photocurable composition.

Polymerization inhibitors for use in the photocurable composition include, for example, p-methoxyphenol, hydroquinone, and alkyl and aryl-substituted hydroquinones and quinones, tert-butyl catechol, pyrogallol, copper resinate, naphthalamines, beta-naphthol, cuprous chloride, 2,6-di-tert-butyl-p-cresol, butylated hydroxytoluene (BHT), oxalic acid, phenothiazine, pyridine, nitrobenzene and dinitrobenzene, p-toluquinone and chloranil. While in some instances it may be desirable to include a polymerization inhibitor such as BHT or similar polymerization inhibitors in the photopolymerizable composition, care must be taken to use BHT and other similar polymerization inhibitors only in an amount and with a combination of other additives such that it does not compromise the imaging properties of the photopolymerizable resin. The polymerization inhibitors may be used in the photocurable composition in an amount of about 0.05 to about 5% by weight. Polymerization inhibitors may or may not be used, but they are preferably used in the embodiment of the invention that involves continuous curing in the reservoir of photocurable composition.

Various dyes and/or colorants may also optionally be used in the practice of the invention although the inclusion of a dye and/or colorant is not necessary to attain the benefits of the present invention. Suitable colorants are designated "window dyes" which do not absorb actinic radiation in the region of the spectrum that the initiator present in the composition is activatable. The colorants include, for example, CI 109 Red dye, Methylene Violet (CI Basic Violet 5), "Luxol." Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), Rhodamine 3 GO (CI Basic Red 4), Rhodamine 6 GDN (CI Basic Red I or CI 45160), 1,1'-diethyl-2,2'-cyanine iodide, Fuchsine dye (CI 42510), Calcocid Green S (CI 44090), Anthraquinone Blue 2 GA (CI Acid Blue 58), Solvaperm Red BB (Solvent Red 195), etc.

Other additives including antiozonants, fillers or reinforcing agents, UV absorbers, etc. may also be included in the photocurable composition, depending on the final properties desired. Such additives are generally well known in the art. However, care must be taken to ensure that the use of these other additives do not compromise the crosslinking properties of the photocurable composition.

Suitable fillers and/or reinforcing agents include immiscible, polymeric or nonpolymeric organic or inorganic fillers or reinforcing agents which are essentially transparent at the wavelengths used for curing the photocurable composition and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

By using continuous liquid interphase 3D methods to produce a flexographic printing plate, the resulting flexographic printing plate has a Shore A hardness of between 25 and 95, preferably about 45 and about 70, more preferably between about 50 and about 65. The resulting flexographic printing plate has elastomeric elongations preferably greater than 50%. The thickness of the flexographic printing plate is between about 0.030 and about 0.250 inches. By using a floor of procured photopolymer, the physical properties of the floor can be different from the physical properties of the relief features.

A plurality of printing dots, with desirable characteristics for printing, can be produced on the surface of the flexographic printing plate using a continuous liquid interphase production method. The planarity of the top of a dot can be measured as the radius of curvature across the top surface of the dot, $r_e$. It is noted that a rounded dot surface is not ideal from a printing perspective because the size of the contact patch between the print surface and the dot varies exponentially with impression force. Therefore, the top of the dot preferably has a planarity where the radius of curvature of the dot top is greater than the thickness of the crosslinked photocurable composition layer, more preferably at least twice the thickness of the layer, and most preferably more than three times the total thickness of the crosslinked photocurable composition layer.

Another desirable printing dot characteristic is edge sharpness. Edge sharpness relates to the presence of a well-defined boundary between the printing dot top and the shoulder and it is generally preferred that the dot edges be sharp and defined. These well-defined dot edges better separate the "printing" portion from the "support" portion of the dot, allowing for a more consistent contact area between the dot and the substrate during printing.

Edge sharpness can be defined as the ratio of $r_e$, the radius of curvature (at the intersection of the shoulder and the top of the dot) to p, the width of the dot's top or printing surface. For a truly round-tipped dot, it is difficult to define the exact printing surface because there is not really an edge in the commonly understood sense, and the ratio of $r_e$:p can approach 50%. In contrast, a sharp-edged dot would have a very small value of $r_e$, and $r_e$:p would approach zero. In practice, an $r_e$:p of less than 5% is preferred, with an $r_e$:p of less than 2% being most preferred.

The continuous liquid interphase method of printing, including three dimensional printing, allows for the tailoring of the shape of the printing dots produced such that relief structures such as dots can be printed in the precise shape determined to provide the optimum printing characteristics.

In addition to creating preferred printing dot characteristics on the flexographic printing plate, by using a continuous liquid interphase production method, there is little to no waste. All unused photopolymer composition remains in the reservoir and can be used in the production of further flexographic printing plates or stored for subsequent use. The continuous liquid interphase method for producing a flexographic printing plate is also much less time consuming than traditional 3D printing methods, which involve a repetitive layering process that typically takes hours or up to days to complete. A flexographic printing plate can be produced in a matter of minutes using this continuous liquid interphase method.

Finally, it should also be understood that the following claims are intended to cover all of the generic and specific features of the invention described herein and all statements of the scope of the invention that as a matter of language might fall there between.

What is claimed is:

1. A method of making a flexographic printing plate is provided, said method comprising:
   a) providing a liquid photocurable composition in a reservoir, wherein the photocurable composition comprises:
      i) a binder resin;
      ii) monomers;
      iii) a photoinitiator; and
      iv) a polymerization inhibitor;
   wherein the reservoir contains a transparent bottom, and wherein actinic radiation is capable of shining through the transparent bottom; and
   b) providing a carrier plate comprising a substrate and a cured layer of photopolymer on said substrate wherein the cured layer of photopolymer provides a surface on which a flexographic printing plate is formed, wherein the reservoir is below the carrier plate;
   c) bringing the cured layer of photopolymer into contact with the liquid photocurable composition in the reservoir;
   d) selectively providing actinic radiation beneath the transparent bottom of the reservoir in a pattern that corresponds to raised relief structures to be formed on the cured layer of photopolymer, wherein the radiation crosslinks and cures areas of the liquid photocurable composition in the reservoir;
   e) moving the carrier plate away from the reservoir while the actinic radiation continuously crosslinks and cures the photocurable composition to form a flexographic printing plate, wherein raised features of the flexographic printing plate are formed on the cured layer of photopolymer on the carrier plate simultaneously as the carrier plate is withdrawn from the reservoir.

2. The method according to claim 1, wherein the liquid photocurable composition further comprises a filler.

3. The method according to claim 1, wherein the flexographic printing plate comprises a plurality of printing dots.

4. The method according to claim 3, wherein the printing dots have a planarity where the radius of curvature of the dot top is greater than the thickness of the crosslinked and cured photocurable composition.

5. The method according to claim 4, wherein the printing dots have a planarity where the radius of curvature of the dot top is at least twice the thickness of the crosslinked and cured photocurable composition.

6. The method according to claim 5, wherein the printing dots have a planarity where the radius of curvature of the dot top is more than three times the total thickness of the crosslinked and cured photocurable composition.

7. The method according to claim 1, wherein the printing dots have an $r_e$:p of less than 5%.

8. The method according to claim 7, wherein the printing dots have an $r_e$:p of less than 2%.

9. The method according to claim 1, wherein the flexographic printing plate has elastomeric elongation greater than 50%.

10. The method according to claim 1, wherein the liquid photocurable composition in the reservoir is different from the composition of the cured layer of photopolymer, whereby the physical properties of the photocurable composition, when cured, are different from the physical properties of the cured layer of photopolymer.

11. The method according to claim 1, wherein the thickness of the flexographic printing plate is between 0.030 and 0.250 inches.

12. The method according to claim 1, wherein the polymerization inhibitor is selected from the group consisting of p-methoxyphenol, hydroquinone, alkyl and aryl-substituted hydroquinones, tent-butyl catechol, pyrogallol, copper resinate, cuprous chloride, 2,6-di-tert-butyl-p-cresol, butylated hydroxytoluene (BHT), oxalic acid, pyridine, nitrobenzene and dinitrobenzene, p-toluquinone, chloranil and combinations thereof.

13. A method of making a flexographic printing plate, said method comprising:
   a) providing a liquid photocurable composition in a reservoir of a three dimensional printer, wherein the liquid photocurable composition comprises:
      i) a binder resin;
      ii) monomers; and
      iii) a photoinitiator; and
   b) providing a carrier plate comprising a substrate and a cured layer of photopolymer on said substrate wherein the cured layer of photopolymer provides a surface on which a flexographic printing plate is formed; and c) using the three dimensional printer to print liquid photocurable composition onto the cured layer of photopolymer while exposing the printed photocurable composition to actinic radiation to cure the printed photocurable composition and form raised relief features on the cured layer of photopolymer.

14. The method according to claim 13, wherein the flexographic printing plate comprises a plurality of printing dots.

15. The method according to claim 14, wherein the printing dots have a planarity where the radius of curvature of the dot top is greater than the thickness of the crosslinked and cured photocurable composition.

16. The method according to claim 15, wherein the printing dots have a planarity where the radius of curvature of the dot top is at least twice the thickness of the crosslinked and cured photocurable composition.

17. The method according to claim 16, wherein the printing dots have a planarity where the radius of curvature of the dot top is more than three times the total thickness of the crosslinked and cured photocurable composition.

18. The method according to claim 13, wherein the printing dots have an $r_e$:p of less than 5%.

19. The method according to claim 18, wherein the printing dots have an $r_e$:p of less than 2%.

20. The method according to claim 13, wherein the flexographic printing plate has elastomeric elongation greater than 50%.

21. The method according to claim 13, wherein the liquid photocurable composition in the reservoir is different from the composition of the cured layer of photopolymer, whereby the physical properties of the photocurable composition, when cured, are different from the physical properties of the cured layer of photopolymer.

22. The method according to claim 13, wherein the thickness of the flexographic printing plate is between 0.030 and 0.250 inches.

23. The method according to claim 1, wherein the flexographic printing plate has a Shore A hardness between 45 and 70.

24. The method according to claim 13, wherein the flexographic printing plate has Shore A hardness between 45 and 70.

25. The method according to claim 13, wherein the liquid photocurable composition further comprises a polymerization inhibitor, wherein the polymerization inhibitor is selected from the group consisting of p-methoxyphenol, hydroquinone, alkyl and aryl-substituted hydroquinones, tert-butyl catechol, pyrogallol, copper resinate, cuprous chloride, 2,6-di-tert-butyl-p-cresol, butylated hydroxytoluene (BHT), oxalic acid, pyridine, nitrobenzene and dinitrobenzene, p-toluquinone, chloranil and combinations thereof.

* * * * *